United States Patent
Lee et al.

(10) Patent No.: US 7,971,117 B2
(45) Date of Patent: Jun. 28, 2011

(54) TEST CIRCUITS OF SEMICONDUCTOR MEMORY DEVICE FOR MULTI-CHIP TESTING AND METHOD FOR TESTING MULTI CHIPS

(75) Inventors: Byong-Kwon Lee, Goyang-si (KR); Young-Dae Lee, Yongin-si (KR); Chang-Sik Kim, Suwon-si (KR); Soo-Hwan Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 469 days.

(21) Appl. No.: 12/010,361

(22) Filed: Jan. 24, 2008

(65) Prior Publication Data

US 2008/0178054 A1 Jul. 24, 2008

(30) Foreign Application Priority Data

Jan. 24, 2007 (KR) ........................ 10-2007-0007429

(51) Int. Cl.
G01R 31/28 (2006.01)
G06F 7/02 (2006.01)
(52) U.S. Cl. ........................ 714/736; 714/819
(58) Field of Classification Search .................. 714/718, 714/719, 736, 819, 735, 722, 703, 742, 724; 365/200, 201, 189.011
See application file for complete search history.

(56) References Cited

U.S. PATENT DOCUMENTS

| 4,639,919 | A | * | 1/1987 | Chang et al. .................. 714/743 |
| 5,384,784 | A | * | 1/1995 | Mori et al. ..................... 714/718 |
| 5,539,702 | A | | 7/1996 | Ahn |
| 5,644,578 | A | | 7/1997 | Ohsawa |
| 5,646,948 | A | * | 7/1997 | Kobayashi et al. ........... 714/719 |
| 5,903,576 | A | | 5/1999 | Yoshiba |
| 6,119,257 | A | | 9/2000 | Negishi |
| 6,332,152 | B1 | * | 12/2001 | Ohashi et al. .................. 708/490 |
| 6,553,528 | B1 | | 4/2003 | Komoike |
| 6,564,237 | B2 | * | 5/2003 | Ohashi et al. .................. 708/490 |
| 6,691,264 | B2 | * | 2/2004 | Huang ........................... 714/723 |
| 7,024,598 | B2 | * | 4/2006 | Jeong et al. ..................... 714/704 |
| 7,119,567 | B2 | * | 10/2006 | Ma et al. ........................ 324/763 |
| 7,222,272 | B2 | * | 5/2007 | Takazawa et al. ............ 714/718 |
| 7,360,116 | B2 | * | 4/2008 | Nakamura ....................... 714/30 |
| 7,426,663 | B2 | * | 9/2008 | Takazawa et al. ............ 714/718 |
| 7,449,909 | B2 | * | 11/2008 | Ma et al. ........................ 324/763 |
| 7,603,595 | B2 | * | 10/2009 | Sasaki ............................ 714/718 |
| 7,673,196 | B2 | * | 3/2010 | Yoshihara ...................... 714/722 |
| 2006/0013046 | A1 | | 1/2006 | Kim et al. |
| 2008/0101142 | A1 | * | 5/2008 | Nakagawa et al. ........... 365/200 |
| 2008/0165596 | A1 | * | 7/2008 | Cheon et al. ............. 365/189.15 |

FOREIGN PATENT DOCUMENTS

JP 63-241791 A 10/1988
KR 96-0002016 B1 2/1996

* cited by examiner

Primary Examiner — Phung M Chung
(74) Attorney, Agent, or Firm — Lee & Morse, P.C.

(57) ABSTRACT

A test circuit of a semiconductor memory device for performing a test in cooperation with a tester having a plurality of input/output pins connected to a plurality of input/output lines. The test circuit may include a first comparing unit adapted to compare, on a bit-by-bit basis, read data that may be read from memory cells corresponding to an address with expected data, and to output the comparison results as first comparison signals, a second comparing unit adapted to perform a logic operation on the first comparison signals and to generate a flag signal when determining a failure of at least one of the memory cells on the basis of the operation result, and a storage unit adapted to store the first comparison signals in response to the flag signal.

20 Claims, 6 Drawing Sheets

TEST CIRCUITS OF SEMICONDUCTOR MEMORY DEVICE FOR MULTI-CHIP TESTING AND METHOD FOR TESTING MULTI CHIPS

BACKGROUND OF THE INVENTION

1. Field of the Invention

Example embodiments relate to test circuits of a semiconductor memory device for multi-chip testing and methods for testing the multi-chips.

2. Description of Related Art

In general, semiconductor memory devices, e.g., dynamic random access memories (DRAMs), may require a correct data read and write operation, which may be realized when there is no memory cell failure in a semiconductor chip. However, as semiconductor chips become highly integrated, more memory cells may be required, which may result in more failures, even though the memory cells may be fabricated using advanced fabrication techniques. Accordingly, if cells are not correctly tested for failures, semiconductor memory devices may lose their reliability.

However, testing a highly integrated semiconductor memory device on a cell-by-cell basis may increase test time and cost. Accordingly, to reduce the test time of the semiconductor memory device, several devices and methods have been currently developed, such as, a parallel bit test method.

The parallel bit test method may employ an exclusive OR (XOR) logic circuit or an exclusive NOR (XNOR) logic circuit. In other words, the same data may be written to a plurality of memory cells, and then read and subjected to logic operation by the XOR or XNOR logic circuits. When the read data is at the same logic state, a corresponding cell may be determined as accepted; and when any of the read data is at a different logic state, the corresponding cell may be determined as failed. Accordingly, the parallel bit test method may reduce testing time.

Further, in the parallel bit test, the test operation may be performed by a tester. The tester may generate control signals including a command, an address, and a test data pattern according to a user-programmed order, and may apply the control signals to the chips to be tested. For example, to test the semiconductor memory device, test data may be written to the address, and the data may be read from the address and output as DQ data. The tester may then compare the DQ data output from the semiconductor memory device with expected data (expected as an output) to determine the condition (e.g., pass or fail) of the semiconductor memory device. Accordingly, a user can recognize a failed semiconductor memory device (or the address) and may perform a suitable repair process using the address.

However, a tester used for the parallel bit test method may have only a limited number of DQ pins, making it difficult to test a plurality of semiconductor memory devices or chips. For example, a tester with 16 DQ pins may be capable of simultaneously testing two semiconductor memory devices by performing alternating testing by 8 bits, however, the tester with 16 DQ pins may not be able to simultaneously test three or more semiconductor memory devices. Accordingly, there may be a need for a scheme capable of simultaneously testing a plurality of semiconductor memory devices using an existing tester.

SUMMARY OF THE INVENTION

Example embodiments are therefore directed to a semiconductor memory device and methods thereof, which substantially overcome one or more of the problems due to the limitations and disadvantages of the related art.

It is therefore a feature of example embodiments to provide a test circuit of a semiconductor memory device for multi-chip testing.

It is therefore another feature of example embodiments to provide a method for testing multi-chips which may reduce testing time.

It is therefore another feature of example embodiments to provide a test circuit of a semiconductor memory device for multi-chip testing and a method of testing multi-chips by simultaneously testing a plurality of semiconductor chips or devices.

It is therefore another feature of example embodiments to provide a test circuit of a semiconductor memory device for multi-chip testing and a method for testing multi-chips to increase efficiency.

At least one of the above and other features of exemplary embodiments may provide a test circuit of a semiconductor memory device for performing a test in cooperation with a tester having a plurality of data input/output pins connected to a plurality of data input/output lines. The test circuit may include a first comparing unit adapted to compare, on a bit-by-bit basis, read data that may be read from memory cells corresponding to an address with expected data, and to output the comparison results as first comparison signals, a second comparing unit adapted to perform a logic operation on the first comparison signals and to generate a flag signal when determining a failure of at least one of the memory cells on the basis of the operation result, and a storage unit adapted to store the first comparison signals in response to the flag signal.

The storage unit may serially output the first comparison signals in response to a test clock signal. The test clock signal may be generated and applied to the storage unit when the flag signal is generated. The storage unit may include a plurality of register circuits, the number of the register circuits corresponding to a number of the first comparison signals. The storage unit may serially output the first stored comparison signals via one input/output line in response to a data output enable signal and the test clock signal. The data output enable signal may be separately generated when the flag signal is generated.

The first comparing unit may include a plurality of XOR circuits, the number of the XOR circuits corresponding to a bit number of the read data or the expected data. The second comparing unit may include at least one OR circuit for receiving the first comparison signals as input signals and performing logic operation on the first comparison signals.

The test circuit may further include a latch unit adapted to latch the expected data. The test circuit may further include a switching unit adapted to perform switching operation, so as to allow the plurality of data input/output lines to be used for multiple purposes.

At least one of the above and other features of exemplary embodiments may be to provide a method for testing a plurality of semiconductor chips. The method may include writing data to memory cells corresponding to an address in each of the plurality of semiconductor chips, the write data being used as expected data, comparing, on a bit-by-bit basis, read data that may be read from the memory cells with the expected data, and outputting the comparison results as first comparison signals, performing a logic operation on the first comparison signals, generating a flag signal when determining a failure of at least one of the memory cells on the basis of the operation result, and storing the first comparison signals in response to the flag signal.

The method may further include serially outputting the first comparison signals as an output signal in response to a test clock signal. The test clock signal may be generated in response to the flag signal. After serially outputting the output signal, the method may determine which memory cell among the memory cells corresponding to the address has failed on the basis of the output signal.

The method may further include latching the write data as the expected data after writing the write data. After latching the expected data, the method may perform switching operation for allowing a plurality of transmission lines for inputting the expected data on a bit-by-bit basis to be used as a flag-signal transmission line or an output signal transmission line for outputting the first comparison signals as an output signal.

Each semiconductor chip may include one flag-signal transmission line and one output signal transmission line for serially outputting the first comparison signals as an output signal upon failure. The expected data may be common to the plurality of semiconductor chips. The test clock signal may be common to the plurality of semiconductor chips.

The method may further include generating a data output enable signal when the flag signal is generated, and serially outputting the first comparison signals as an output signal in response to at least one of a test clock signal and the data output enable signal.

BRIEF DESCRIPTION OF THE DRAWINGS

The above and other features and advantages of example embodiments will become more apparent to those of ordinary skill in the art by describing in detail example embodiments thereof with reference to the attached drawings, in which.

DETAILED DESCRIPTION OF THE INVENTION

Korean Patent Application No. 10-2007-0007429, filed on Jan. 24, 2007, in the Korean Intellectual Property Office, and entitled: "Test Circuits of Semiconductor Memory Device for Multi-Chip Testing and Method for Testing Multi Chips," is incorporated by reference herein in its entirety.

Example embodiments will now be described more fully hereinafter with reference to the accompanying drawings. The invention may, however, be embodied in different forms and should not be construed as limited to the embodiments set forth herein. Rather, these example embodiments are provided so that this disclosure will be thorough and complete, and will fully convey the scope of the invention to those skilled in the art.

Figure 1:
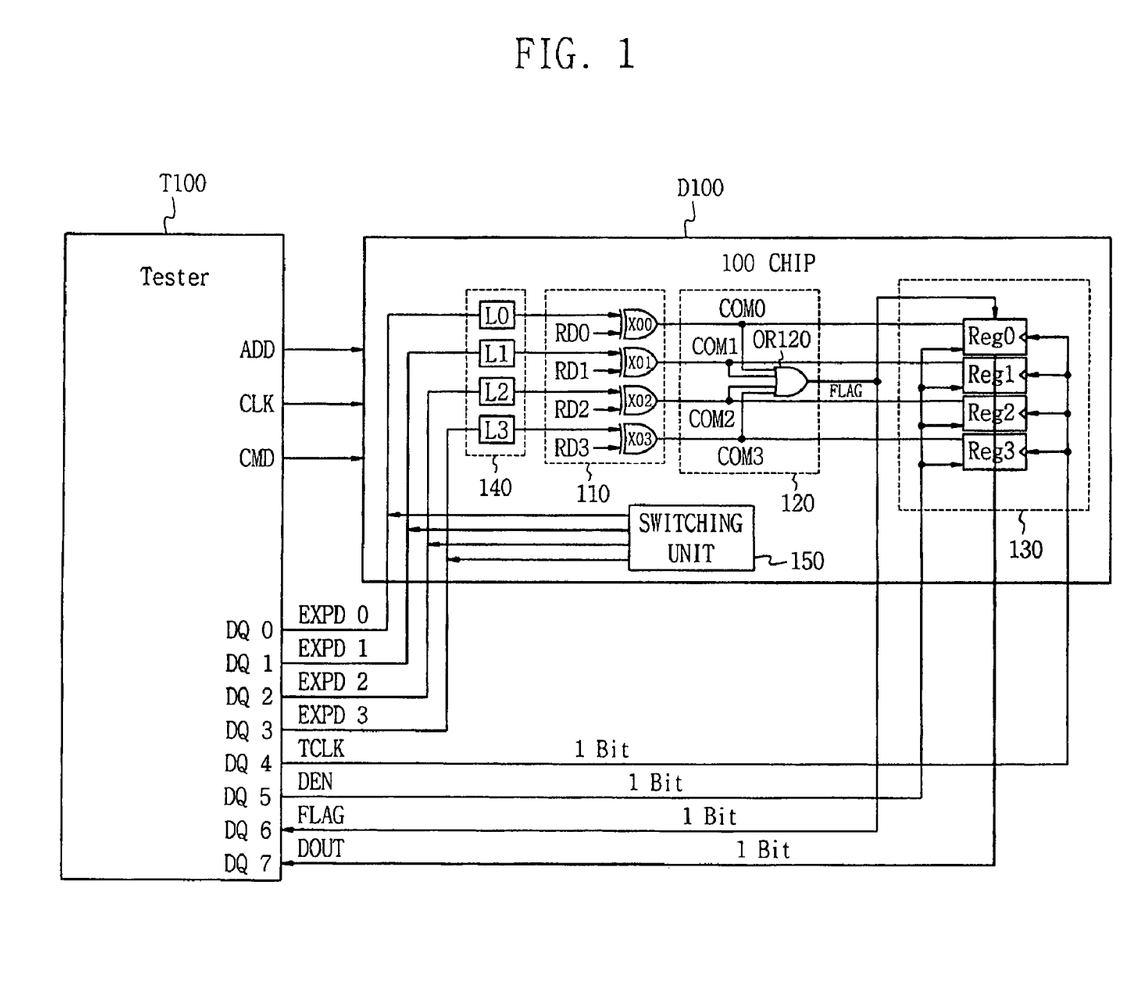
FIG. 1 illustrates a block diagram of a test circuit of a semiconductor memory device and a tester according to an example embodiment.

FIG. 1 illustrates a block diagram of a test circuit D100 of a semiconductor memory device 100 and a tester T100 for testing the semiconductor memory device 100 according to an example embodiment.

Referring to FIG. 1, the test circuit D100 of the semiconductor memory device 100 may include a first comparing unit 110, a second comparing unit 120, and a storage unit 130. The test circuit D100 may further include a latch unit 140 and a switching unit 150.

The first comparing unit 110 may compare, on a bit-by-bit basis, a plurality of read data RD0 to RD3 read according to addresses from the tester T100 with a plurality of expected data EXPD0 to EXPD3 (expected as outputs), and may output first comparison signals COM0 to COM3. The expected data EXPD0 to EXPD3 may be applied from DQ pins of the tester T100.

The first comparing unit 110 may include a plurality of XOR circuits XO0 to XO3 so as to compare the read data RD0 to RD3 with the expected data EXPD0 to EXPD3. The XOR circuits XO0 to XO3 may output a logic low signal when the input data are at the same logic state, and may output a logic high signal when the input data are at a different logic state. Accordingly, when one or more of the first comparison signals COM0 to COM3 outputs a logic high signal, at least one memory cell corresponding to the read data RD0 to RD3 may fail.

Although example embodiments disclose the first comparing unit 110 as comparing the 4-bit read data RD0 to RD3 with the 4-bit expected data EXPD0 to EXPD3 through the four XOR circuits XO0 to XO3, it should be appreciated that the first comparing unit 110 may be configured for comparing with more than 4 bit data.

The second comparing unit 120 may perform a logic operation on the first comparison signals COM0 to COM3 input from the first comparing unit 110, and may output the operation result. The second comparing unit 120 may determine whether at least one of the cells corresponding to the read data RD0 to RD3 has failed based on the operation result, and may generate a flag signal FLAG when failure occurs. The flag signal FLAG may be logic high signal.

The second comparing unit 120 may include at least one OR circuit OR120 for receiving the first comparison signals COM0 to COM3 and performing the logic operation on the first comparison signals COM0 to COM3. The OR circuit OR120 may determine that at least one of the cells corresponding to the read data RD0 to RD3 has failed when one or more of the first comparison signals COM0 to COM3 is high.

In another example embodiment, for more than four first comparison signals COM (e.g., 16 first comparison signals COM), the second comparing unit 120 may have a two-stage structure having five 4-input OR circuits (OR), four performing operation on the first comparison signals COM and one performing operation to output the four OR circuits. It should be appreciated that the second comparing unit 120 may have a similar structure as the above-mentioned structure when having other numbers of first comparison signals COM.

The storage unit 130 may store the first comparison signals COM0 to COM3 in response to the flag signal FLAG. In an example embodiment, the storage unit 130 may store the read data RD0 to RD3, but not the first comparison signals COM0 to COM3. The storage unit 130 may include register circuits REG0 to REG3 corresponding to a number of the first comparison signals COM0 to COM3 (or the read data RD0 to RD3). For example, when the read data RD and the expected data EXPD have respective 4 bits, the storage unit 130 may include 4 register circuits REG, and when the read data RD and the expected data EXPD have respective 16 bits, the storage unit 130 may include 16 register circuits REG. It should be appreciated that other number of bits may be employed. The storage unit 130 may further store the first comparison signals COM0 to COM3 or the read data RD0 to RD3.

When the flag signal FLAG is received, the storage unit 130 may serially output the first stored comparison signals COM0 to COM3 via one data input/output line (e.g., DQ7) in response to an external test clock signal TCLK. When the test clock signal TCLK is output from one of the pins (DQ4) of the tester T100, the flag signal FLAG may be input to the tester T100.

Accordingly, because outputting the data from the storage unit 130 responding to only the test clock signal TCLK may cause a malfunction, another signal, e.g., a data enable signal (DEN), may be used. In other words, when the test clock signal TCLK is input while the data enable signal DEN is kept at an enable state, the data from the storage unit 130 may be serially output, i.e., the storage unit 130 may output the data in response to both the data enable signal DEN and the test clock signal TCLK.

Accordingly, the storage unit 130 may store the first comparison signals COM0 to COM3 in response to only the flag signal FLAG, and may output the data DOUT serially in response to the data enable signal DEN and/or the test clock signal TCLK.

The data DOUT output from the storage unit 130 may be input to the tester T100, so that the tester T100 may determine which cell corresponding to the read data RD0 to RD3 has failed and may repair the failed cell.

The latch unit 140 may latch the expected data EXPD. The latch unit 140 may be used for other purposes when data input/output lines or DQ pins (DQ0, DQ1, DQ2, and DQ3) inputs the expected data EXPD. For example, the latch unit 140 may be used when the data input/output lines or DQ pins (DQ0, DQ1, DQ2, and DQ3) as a flag-signal transmission line or an output-data transmission line for the storage unit 130 so as to test other chips after inputting the expected data EXPD. Because the expected data EXPD may not be continuously input, the latch circuits L0, L1, L2, and L3, which may be capable of latching the input expected data EXPD, may be used.

The latch unit 140 may include a plurality of latch circuits L0, L1, L2, and L3, i.e., the latch unit 140 may include 4 latch circuits L0, L1, L2, and L3 when the expected data EXPD has 4 bits, or 16 register circuits when the expected data EXPD has 16 bits.

The switching unit 150 may be used for other functions when the data input/output lines or DQ pins (DQ0, DQ1, DQ2, and DQ3) transferring the expected data EXPD is used. The switching unit 150 may perform switching operation on the data input/output lines or DQ pins (DQ0, DQ1, DQ2, and DQ3) transferring the expected data EXPD. In other words, after the expected data EXPD is input and latched in the latch unit 140, the switching unit 150 may disconnect the data input/output lines or DQ pins DQ0, DQ1, DQ2, and DQ3 transferring the expected data EXPD from the latch unit 140, so that the data input/output lines or DQ pins may be used for other functions. For example, the data input/output lines or DQ pins DQ0, DQ1, DQ2, and DQ3 may be used as transmission lines for transferring the flag signal FLAG or the output data DOUT of the storage unit 130.

The tester T100 may generate control signals including a read/write command (CMD), an address (ADD), the expected data (EXPD), the test clock signal (TCLK), the data output enable signal (DEN), etc., according to a user-programmed order and may apply the controls signals to the chips to be tested.

Figure 2:
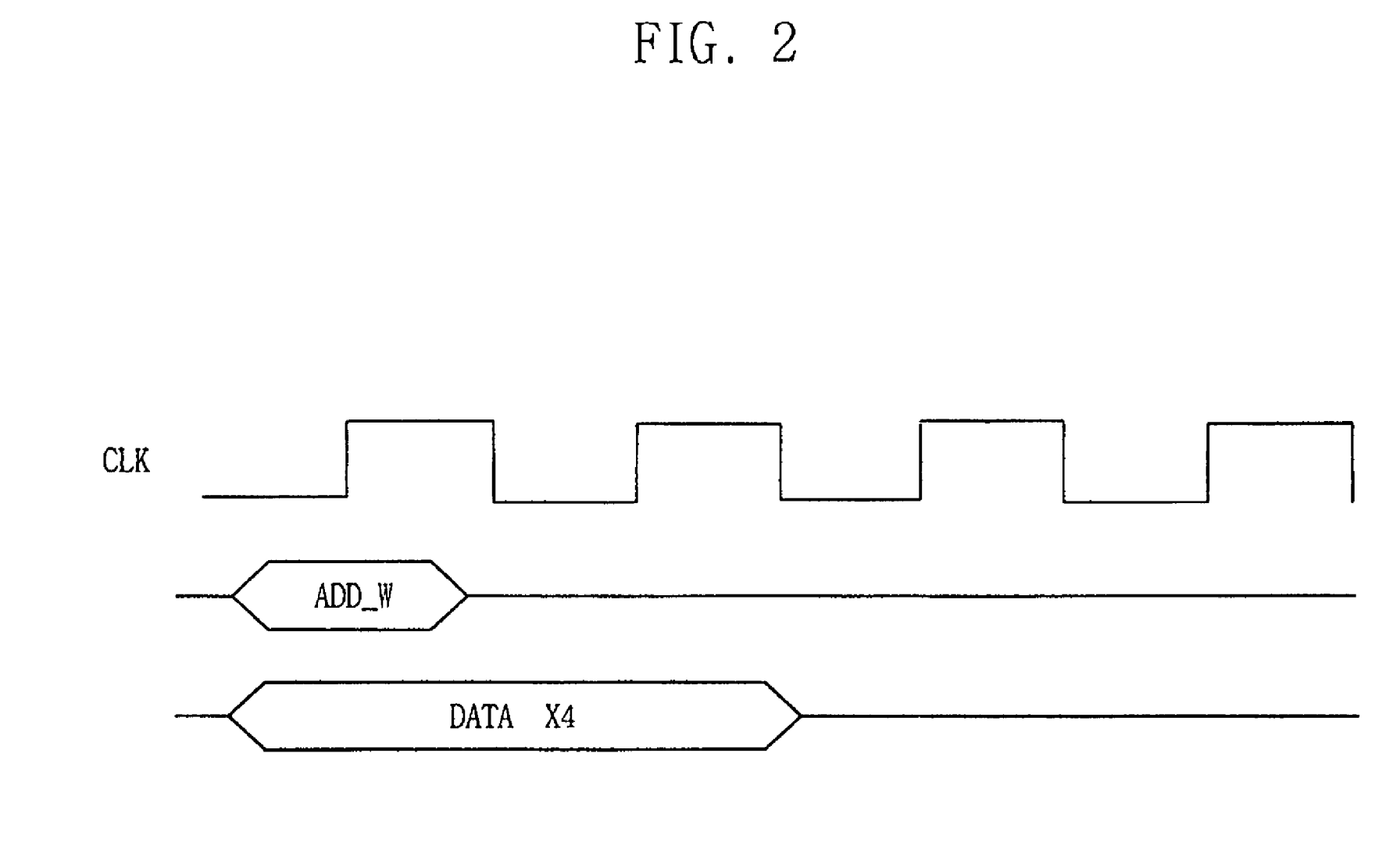
FIGS. 2 and 3 illustrate operation timing diagrams of FIG. 1.

The test operation will now be described with reference to the test operation timing diagrams of FIGS. 2 and 3. FIG. 2 illustrates a timing diagram of a write operation for testing, and FIG. 3 illustrates a timing diagram of a test operation.

As shown in FIG. 2, an address ADD_W for the write operation may be applied from the tester T100, and a write data DATA may be written to cells to be tested that may correspond to the address ADD_W. The write data DATA may be applied by 4 bits (similar to the expected data EXPD of FIG. 1), or may be applied by 16 bits via the DQ pins of the tester T100.

Figure 3:
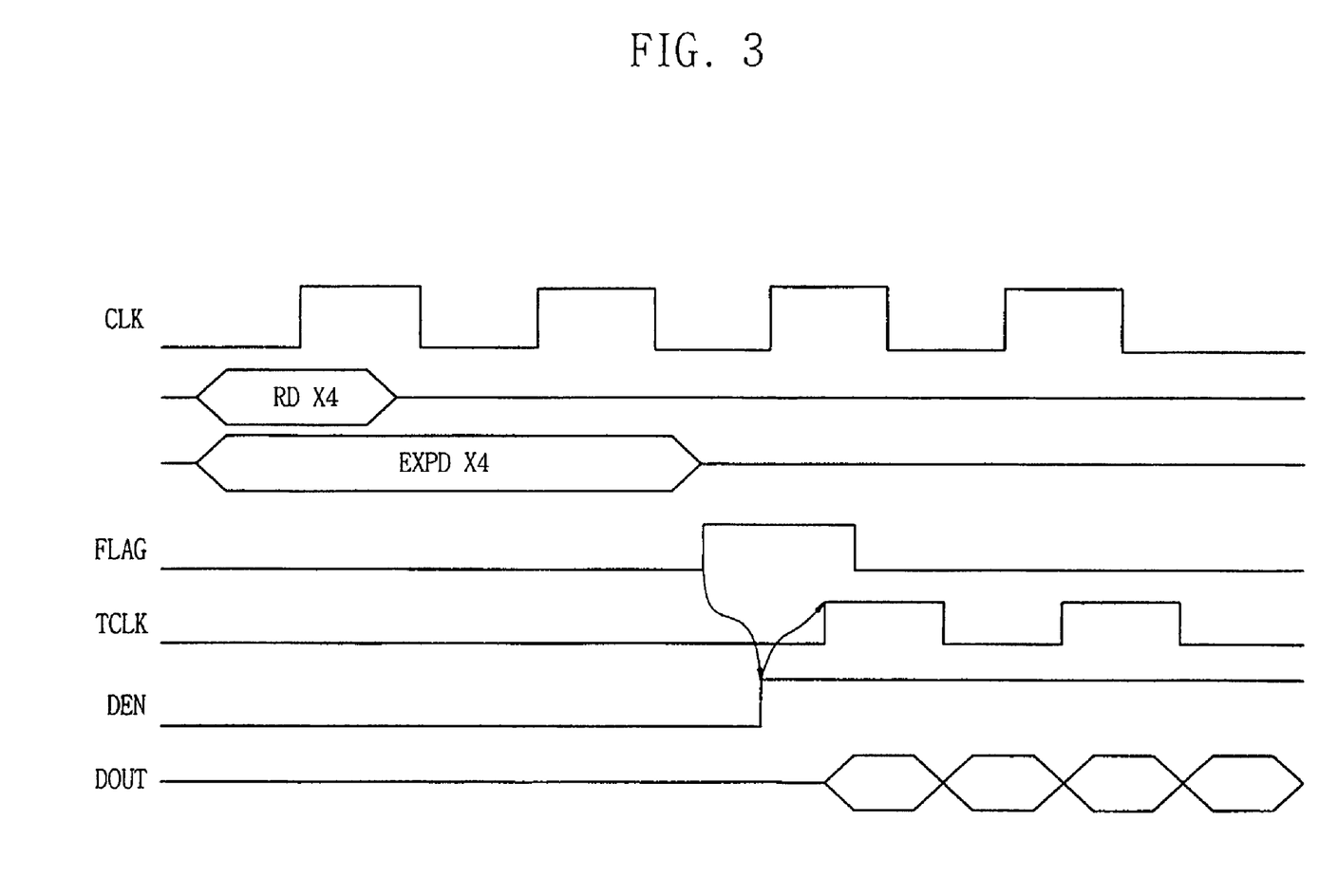

As shown in FIG. 3, when the expected data EXPD is applied to the test circuit D100 in synchronization with the clock signal CLK, and the read data RD is read from the test cells. The expected data EXPD and the read data RD may consist of 4 bits (or more than 4 bits).

In response to the flag signal FLAG from the second comparing unit 120, the tester T100 may generate the test clock signal TCLK and the data output enable signal DEN. In an example embodiment, after the data output enable signal DEN is generated, the test clock signal TCLK may be generated in response to the data output enable signal DEN (as indicated by arrows in FIG. 3). As the test clock signal TCLK is applied to the storage unit 130, data DOUT may be serially output from the storage unit 130.

Figure 4:
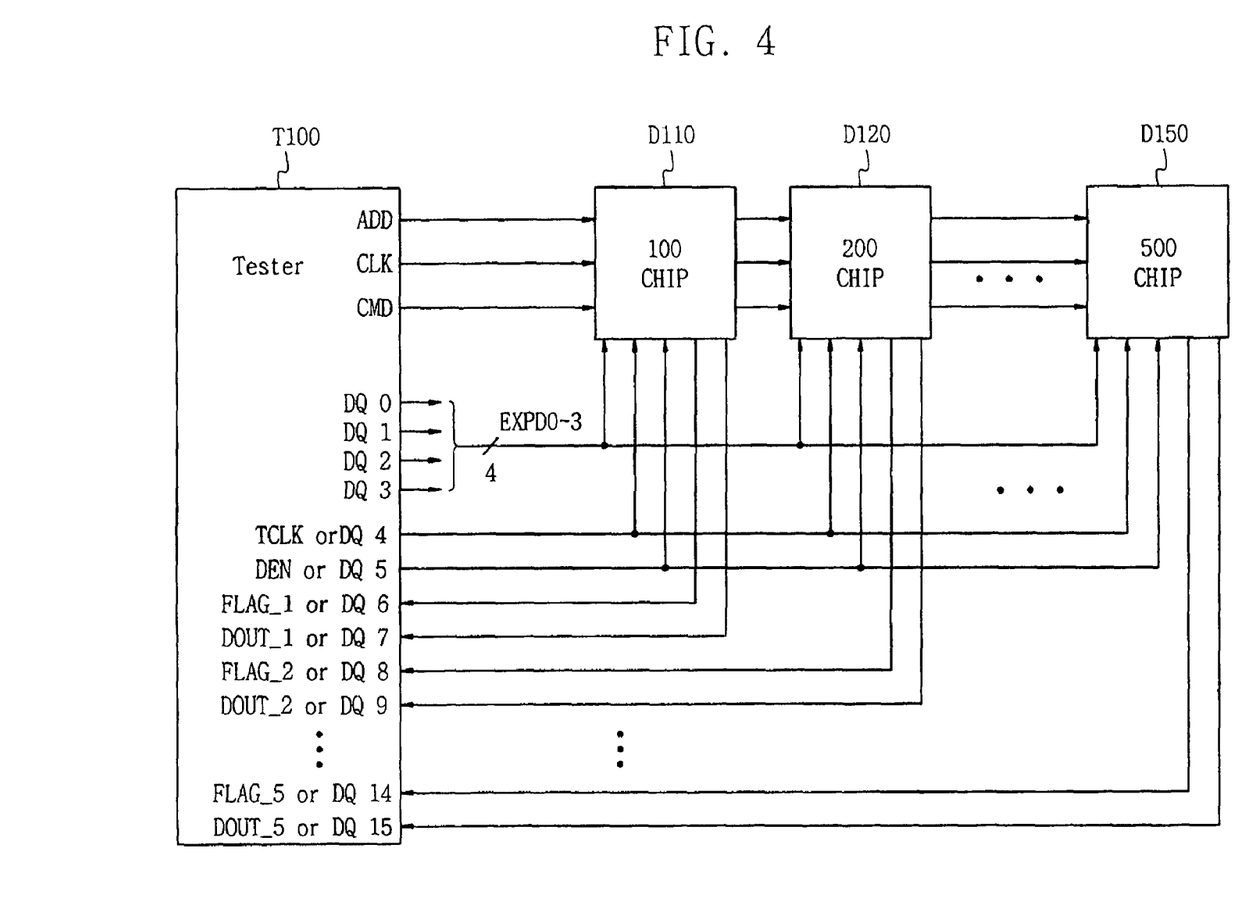
FIGS. 4 to 6 illustrate block diagrams of an operation for testing a plurality of chips.
Figure 5:
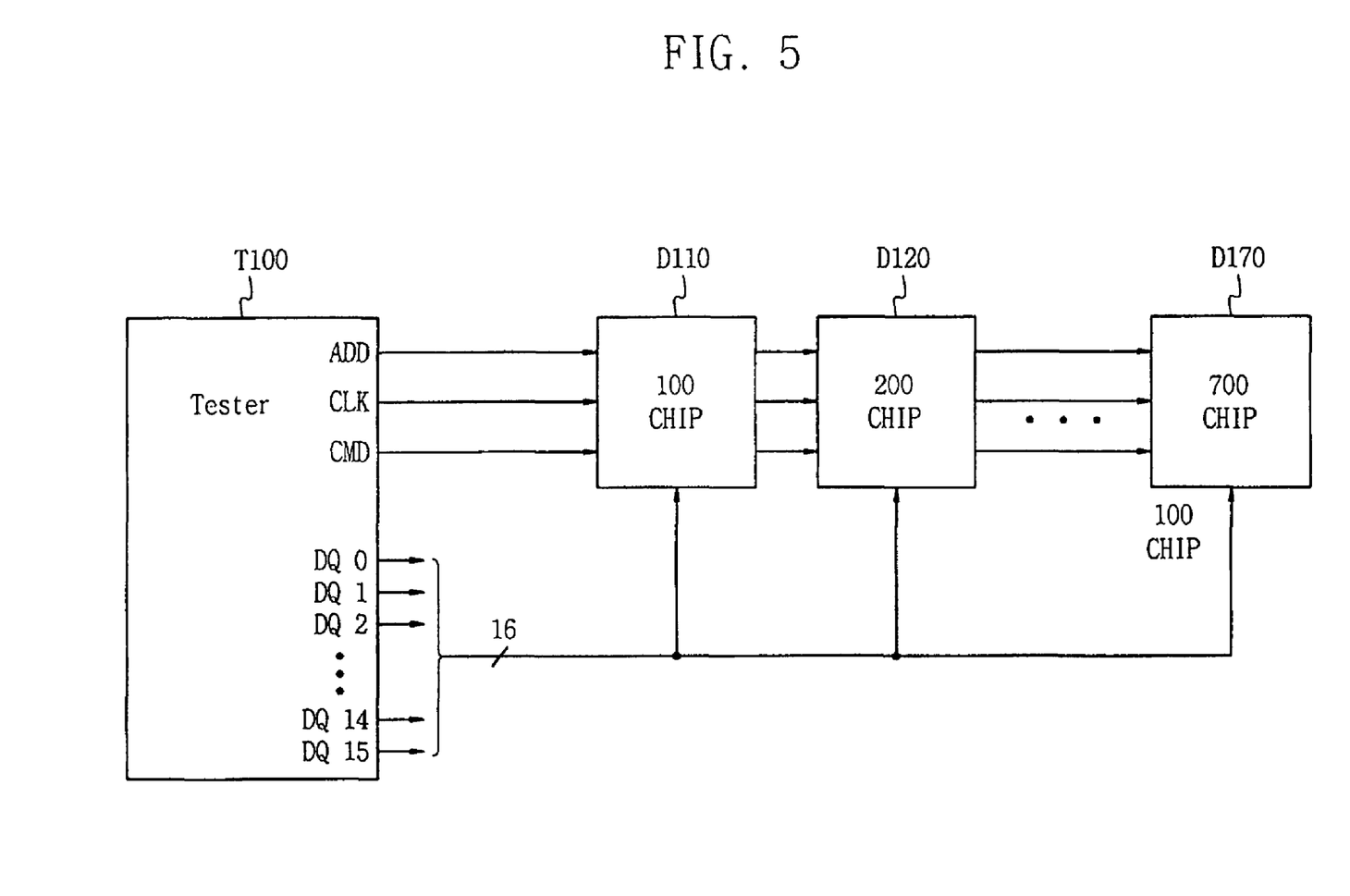
Figure 6:
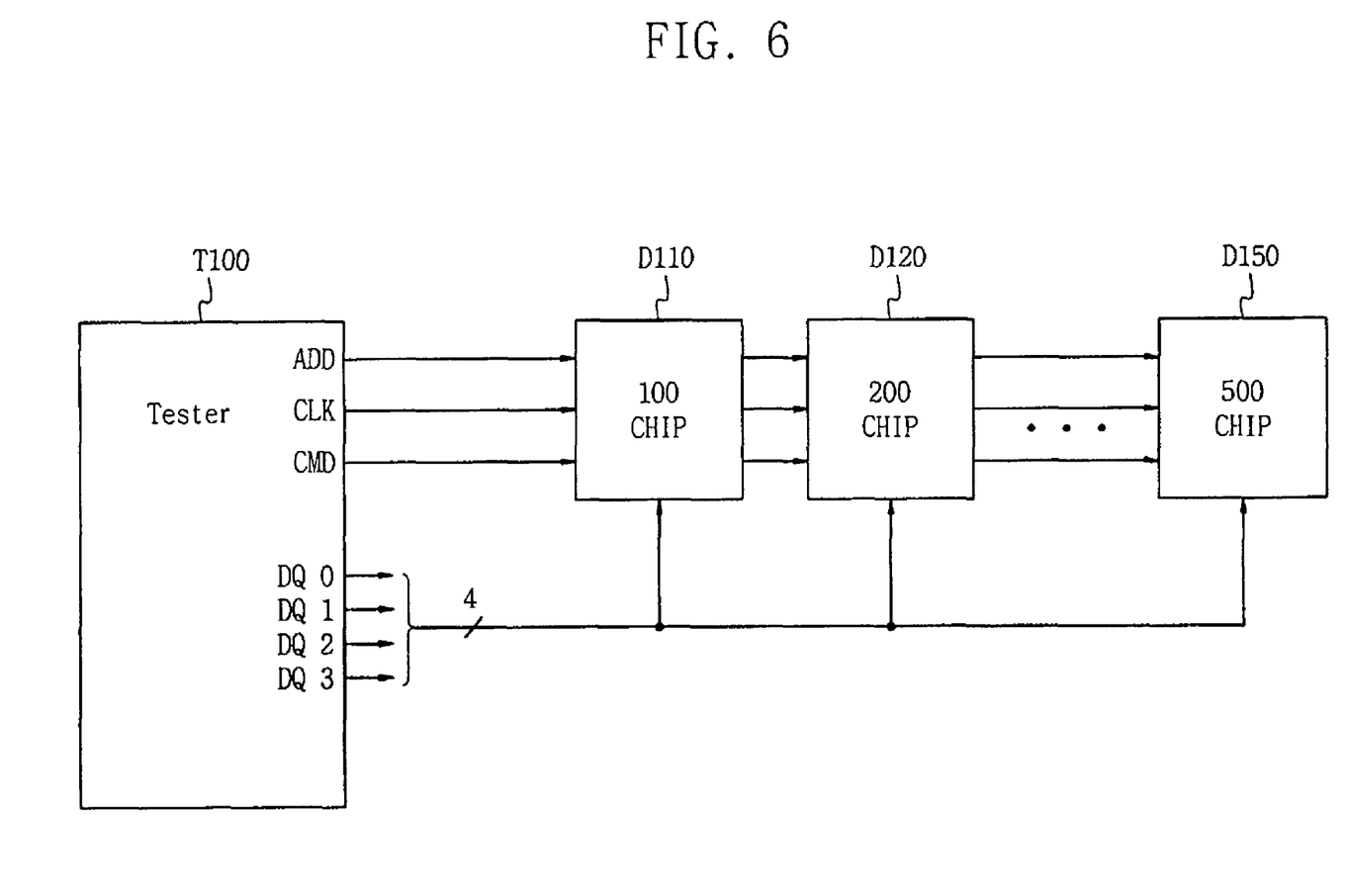

FIGS. 4 to 6 illustrate block diagrams of a method of testing a plurality of chips, each including the respective test circuits. As shown in FIGS. 4 and 5, the tester T100 may have 16 DQ pins DQ (DQ0 through DQ15).

First, data write operation or expected data EXPD input operation for testing may be performed by 4 bits on each of the five chips 100, 200 . . . and 700 using four input/output lines DQ0 to DQ3 (as shown in FIG. 6). Alternatively, data write operation or expected data EXPD input operation may be performed by 16 bits on each of the seven chips 100, 200 . . . , and 700 using all input/output lines DQ0 to DQ15 of the tester T100 (as shown in FIG. 5). In particular, when the expected data EXPD are input, the 16 bits may be simultaneously tested to reduce the test time. In this case, however, the latch unit 140 and the switching unit 150 may be present.

When the expected-data input lines DQ0, DQ1, DQ2, and DQ3 are not used for other purposes (single purpose) in the test circuit D110, D120 . . . , and DI 50 of the chips 100, 200 . . . , and 700, and when the expected-data input lines DQ0, DQ1, DQ2, and DQ3 are used for the other purposes (multiple purposes), will now be described with reference to FIG. 4. It should be appreciated that other purposes may include use of the expected-data input lines DQ0, DQ1, DQ2, and DQ3, such as, a flag-signal transmission line and a serial data output line for testing.

As shown in FIG. 4, when the expected-data input lines DQ0, DQ1, DQ2, and DQ3 are used for a single purpose, the expected data input lines DQ0, DQ1, DQ2, and DQ3, the test clock signal TCLK input line (or DQ4), and the data enable signal DEN input line (or DQ5) may be common to the plurality of chips 100, 200 . . . , and 700. Alternatively, a flag-signal transmission line and a serial data output line may be separately assigned to each of the plurality of chips 100, 200 . . . , and 700.

In an example embodiment, when six input/output lines including the expected data input lines DQ0, DQ1, DQ2, and DQ3, the test clock signal TCLK input line DQ4, and the data enable signal DEN input line DQ5 may be common input lines, two of the other ten input/output lines DQ6 to DQ15 may be used as the flag-signal transmission line and the serial data output line for each chip, wherein the five chips 100, 200 . . . and 700 may be simultaneously tested at most. It should be appreciated that other configurations of the input/output lines DQ0 to DQ15 may be used as the flag-signal transmission line and the serial data output line for the plurality of chips.

Although not shown in FIG. 4, when the expected-data input lines DQ0, DQ1, DQ2, and DQ3 are used for multiple purposes, the expected data input lines DQ0, DQ1, DQ2, and DQ3 may be used as the flag-signal transmission line and the serial data output line for the other chips. As a result, two chips may be further tested, such that a maximum of seven chips may be simultaneously tested.

It should be appreciated that when 16 input/output lines DQ0 to DQ15 are all used for inputting the expected data, one of them may be used as a test clock signal TCLK input line, another may be used as a data enable signal DEN input line, and the others may be used as flag-signal transmission lines and serial data output lines for the chips. In this case, the latch unit 140 and the switching unit 150 may be present.

According to example embodiments, it is possible to reduce testing time and to increase the number of semiconductor chips or devices to be tested simultaneously, thereby improving a test efficiency of a tester. As such, a testing efficiency of the test circuit may be improved. Further, with one tester, five or more chips may be tested simultaneously so as to reduce testing time.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A test circuit for performing a test on a plurality of semiconductor memory chips in cooperation with a tester having a plurality of input/output pins connected to a plurality of input/output lines of the test circuit, the test circuit comprising:
   a plurality of first comparing units adapted to compare, on a bit-by-bit basis, read data that is read from memory cells corresponding to an address in each of the plurality of semiconductor memory chips with expected data applied via each of the plurality of input/output lines of the test circuit, and to output the comparison results as first comparison signals;
   a plurality of second comparing units, each second comparing unit of the plurality of second comparing units being connected to a corresponding first comparing unit of the plurality of first comparing units, being adapted to receive corresponding first comparison signals from the corresponding first comparing unit of the plurality of first comparing units and to perform a logic operation on the corresponding first comparison signals, and being adapted to generate a flag signal when determining a memory cell failure based on the logic operation result; and
   a plurality of storage units, each storage unit of the plurality of storage units being connected to a corresponding second comparing unit of the plurality of second comparing units, being adapted to store the corresponding first comparison signals in response to the flag signal and to serially output the stored corresponding first comparison signals via one of plurality of input/output lines of the test circuit in response to at least one control signal applied via another one of the plurality of input/output lines.

2. The circuit as claimed in claim 1, wherein each storage unit of the plurality of storage units is adapted to serially output the stored corresponding first comparison signals to the tester in response to a test clock signal.

3. The circuit as claimed in claim 2, wherein the test clock signal is generated in response to the flag signal and is applied to one of the plurality of storage units when the flag signal is generated by the corresponding second comparing unit of the plurality of second comparing units.

4. The circuit as claimed in claim 3, wherein each storage unit of the plurality of storage units comprises a plurality of register circuits, the number of the register circuits corresponding to a number of the corresponding first comparison signals.

5. The circuit as claimed in claim 2, wherein each storage unit of the plurality of storage units serially outputs the first stored comparison signals via the one input/output line in response to a data output enable signal and the test clock signal, the data output enable signal being separately generated when the flag signal is generated.

6. The circuit as claimed in claim 1, wherein each first comparing unit of the plurality of first comparing units comprises a plurality of XOR circuits, the number of the XOR circuits corresponding to a bit number of the read data or the expected data.

7. The circuit as claimed in claim 1, wherein each second comparing unit of the plurality of second comparing units comprises at least one OR circuit for receiving the corresponding first comparison signals as input signals and performing logic operation on the first comparison signals.

8. The circuit as claimed in claim 1, further comprising a latch unit adapted to latch the expected data.

9. The circuit as claimed in claim 8, further comprising a switching unit adapted to perform switching operation so as to allow the plurality of data input/output lines to be used for multiple purposes.

10. The circuit as claimed in claim 1, wherein each storage unit of the plurality of storage units serially outputs the first stored corresponding comparison signals in response to a data output enable signal generated in response to the flag signal and a test clock signal generated in response to the data output enable signal, the data output enable signal being kept in stable state when a test clock signal is input to the storage unit.

11. A method for testing a plurality of semiconductor chips with a test circuit in cooperation with a tester having a plurality of input/output pins connected to a plurality of input/output lines of the test circuit, the method comprising:
   writing data to memory cells corresponding to an address in each of the plurality of semiconductor chips;
   comparing, on a bit-by-bit basis, read data that is read from the memory cells with the expected data applied via each of the plurality of input/output lines of the test circuit, and outputting the comparison results as first comparison signals;
   performing logic operations on the first comparison signals;
   generating a flag signal when determining a failure of at least one of the memory cells based on the logic operation results;
   storing the first comparison signals corresponding to the at least one memory cell having the failure in response to the flag signal; and
   serially outputting the stored first comparison signals corresponding to the at least one memory cell having the failure via one of the plurality of input/output lines of the test circuit in response to at least one control signal applied via another one of the plurality of input/output lines.

12. The method as claimed in claim 11, further comprising serially outputting the corresponding first comparison signals as an output signal in response to a test clock signal, the test clock signal being generated in response to the flag signal.

13. The method as claimed in claim 12, further comprising, after serially outputting the output signal, determining which memory cell corresponding to the address has failed on the basis of the output signal.

14. The method as claimed in claim 12, wherein the test clock signal is common to the plurality of semiconductor chips.

15. The method as claimed in claim 11, further comprising, after writing the write data, latching the write data as the expected data.

16. The method as claimed in claim 15, further comprising, after latching the expected data, performing switching operation for allowing each of the plurality of input/output lines of the test circuit for applying the expected data on a bit-by-bit basis to be used as one of a flag-signal transmission line an output signal transmission line for outputting the first comparison signals as an output signal, a test clock signal, and a data output enable signal.

17. The method as claimed in claim 11, wherein each semiconductor chip is connected to one flag-signal transmission line and one output signal transmission line for serially outputting the first comparison signals as an output signal upon failure.

18. The method as claimed in claim 11, wherein the expected data is common to the plurality of semiconductor chips.

19. The method as claimed in claim 11, further comprising generating a data output enable signal when the flag signal is generated, and wherein serially outputting of the first comparison signals is in response to at least one of a test clock signal and the data output enable signal.

20. The method as claimed in claim 11, wherein serial outputting of the first stored comparison signals is in response to a data output enable signal generated in response to the flag signal and a test clock signal generated in response to the data output enable signal, the data output enable signal being kept in stable state when the test clock signal is input to the storage unit.

* * * * *